United States Patent
Koo

(10) Patent No.: US 8,184,482 B2
(45) Date of Patent: May 22, 2012

(54) NONVOLATILE MEMORY DEVICE FOR PREVENTING A SOURCE LINE BOUNCING PHENOMENON

(75) Inventor: Cheul Hee Koo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 57 days.

(21) Appl. No.: 12/648,328

(22) Filed: Dec. 29, 2009

(65) Prior Publication Data

US 2010/0284225 A1    Nov. 11, 2010

(30) Foreign Application Priority Data

May 8, 2009 (KR) .................. 10-2009-0040138

(51) Int. Cl.
    *G11C 16/04* (2006.01)
(52) U.S. Cl. ......... 365/185.18; 365/185.17; 365/185.26; 365/226
(58) Field of Classification Search ............. 365/185.17, 365/185.18, 185.25, 226
    See application file for complete search history.

(56) References Cited

U.S. PATENT DOCUMENTS 7,266,023 B2* 9/2007 Shuto .................. 365/189.09
7,339,828 B2* 3/2008 Hasegawa et al. ....... 365/185.18

FOREIGN PATENT DOCUMENTS

KR    1020060109330    10/2006

OTHER PUBLICATIONS

Notice of Preliminary Rejection issued from Korean Intellectual Property Office on Oct. 26, 2010.

* cited by examiner

*Primary Examiner* — Hoai V Ho
*Assistant Examiner* — Tri Hoang
(74) *Attorney, Agent, or Firm* — IP & T Group LLP

(57) ABSTRACT

A nonvolatile memory device includes a memory cell array configured to include cell strings coupled between respective bit lines and a source line, a unilateral element coupled to the source line, and a negative voltage generation unit coupled to the unilateral element and configured to generate a negative voltage.

10 Claims, 5 Drawing Sheets

NONVOLATILE MEMORY DEVICE FOR PREVENTING A SOURCE LINE BOUNCING PHENOMENON

CROSS-REFERENCE TO RELATED APPLICATIONS

Priority to Korean patent application number 10-2009-0040138 filed on May 8, 2009, the entire disclosure of which is incorporated by reference herein, is claimed.

BACKGROUND

An embodiment of the present invention relates to a nonvolatile memory device and, more particularly, to technology for removing a source line bouncing phenomenon occurring in a nonvolatile memory device.

In recent years, there is an increasing demand for nonvolatile memory devices which can be electrically programmed and erased and which do not require the refresh function of rewriting data at specific intervals.

It is known that a source line bouncing phenomenon is generated in the program, verification, and read operations of such a nonvolatile memory device. Problems such as underprogramming and read failure occur because of the source line bouncing phenomenon.

In the read operation, precharge and discharge operations can be performed through a bit line in order to read data stored in a cell. During these operations, a great amount of current instantly flows into the ground terminal through a source line. Accordingly, a phenomenon occurs in which the source line does not maintain an ideal ground voltage and rises to a predetermined voltage level. Such a phenomenon causes charges, precharged in the bit line, to be discharged, leading to a failure in reading data of the cell.

BRIEF SUMMARY OF THE INVENTION

An embodiment of the present invention relates to a nonvolatile memory device which prevents a source line bouncing phenomenon by enabling a source line to maintain a ground voltage.

A nonvolatile memory device according to an embodiment of the present invention includes a memory cell array including cell strings coupled between respective bit lines and a source line, a unilateral element coupled to the source line, and a negative voltage generation unit coupled to the unilateral element and configured to generate a negative voltage.

The unilateral element may include a diode having a cathode coupled to the negative voltage generation unit and an anode coupled to the source line.

The negative voltage generation unit may generate the negative voltage equal to a threshold voltage of the diode. Here, the negative voltage generation unit may include a negative voltage pump.

The unilateral element may include an NMOS transistor having a gate and a drain coupled together. The negative voltage generation unit may generate the negative voltage equal to a threshold voltage of the NMOS transistor.

The unilateral element may include a PMOS transistor having a gate and a source coupled together. Here, the negative voltage generation unit may generate the negative voltage equal to a threshold voltage of the PMOS transistor.

The nonvolatile memory device may further include a ground voltage supply unit configured to couple the source line to a ground terminal. The ground voltage supply unit may include an NMOS transistor.

A nonvolatile memory device according to another embodiment of the present invention includes a memory cell array including cell strings coupled between respective bit lines and a source line, and a ground voltage maintenance unit coupled to the source line and configured to maintain a voltage of the source line at a ground voltage.

The ground voltage maintenance unit may include a ground voltage supply unit configured to couple the source line to a ground terminal. Here, the ground voltage supply unit may include an NMOS transistor.

The ground voltage maintenance unit may include a unilateral element configured to transfer the increased voltage externally upon a voltage of the source line being increased to a voltage greater than a ground voltage, and a negative voltage generation unit coupled to the unilateral element and configured to generate a negative voltage in response to the increased voltage.

The unilateral element may include a diode having a cathode coupled to the negative voltage generation unit and an anode coupled to the source line.

The negative voltage generation unit may generate the negative voltage equal to a threshold voltage of the diode. Here, the negative voltage generation unit may include a negative voltage pump.

The unilateral element may include an NMOS transistor having a gate and a drain coupled together. The negative voltage generation unit may generate the negative voltage equal to a threshold voltage of the NMOS transistor.

The unilateral element may include a PMOS transistor having a gate and a source coupled together. Here, the negative voltage generation unit may generate the negative voltage equal to a threshold voltage of the PMOS transistor.

The negative voltage generation unit may generate the negative voltage such that a voltage at an output terminal of the unilateral element maintains a negative voltage equal to a threshold voltage of the unilateral element. When a voltage at an output terminal of the unilateral element is less than a set voltage, the negative voltage generation unit may fail to generate the negative voltage.

DESCRIPTION OF THE INVENTION

Figure 1:
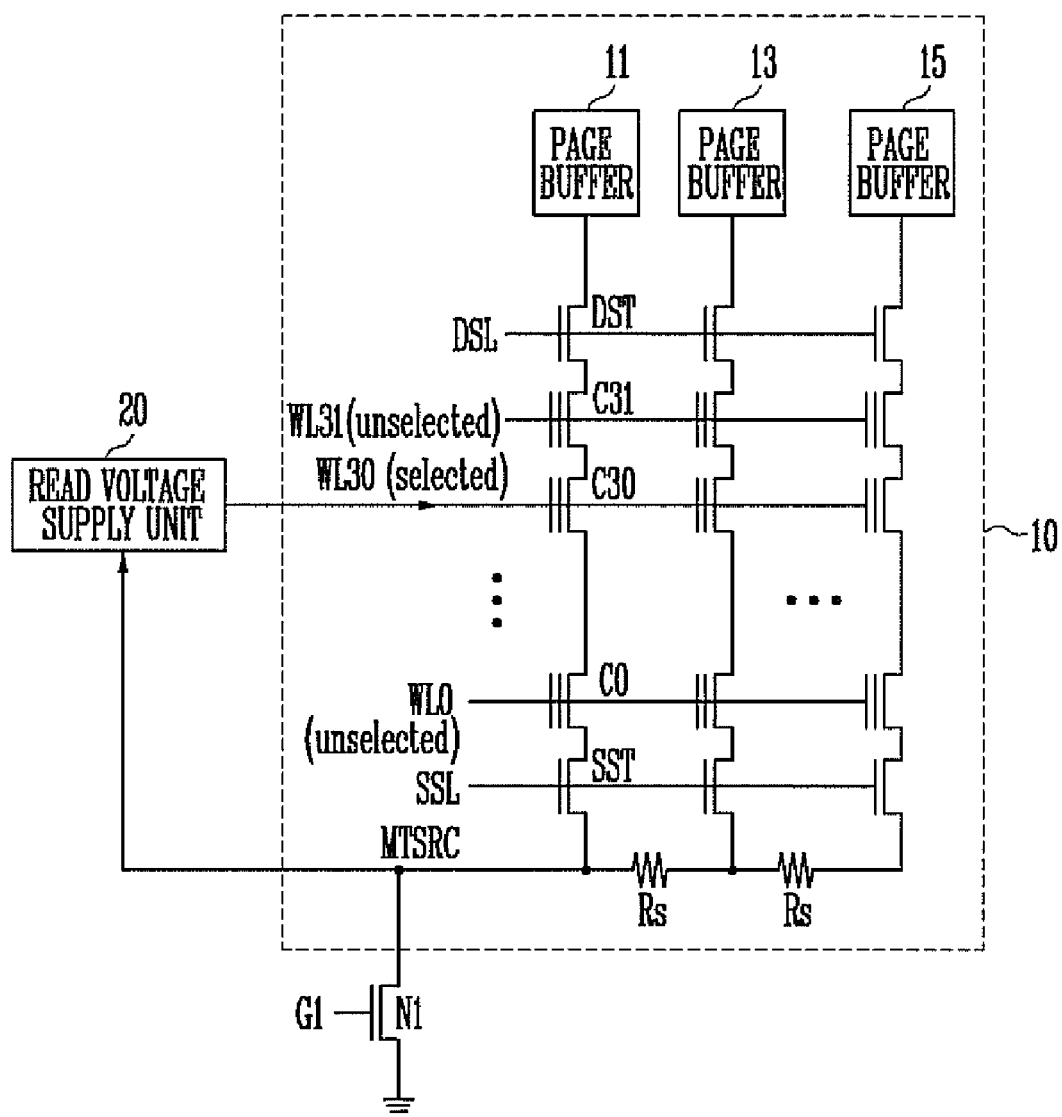
FIG. 1 is a circuit diagram of a nonvolatile memory device.

Hereinafter, embodiments of the present invention are described in detail with reference to the accompanying drawings. The drawing figures are provided to allow those having ordinary skill in the art to understand the scope of the embodiments of the present invention.

FIG. 1 is a circuit diagram of a nonvolatile memory device. The nonvolatile memory device includes a memory cell array 10, page buffers 11, 13, and 15, and a read voltage supply unit 20.

Referring to FIG. 1, in a read operation, a signal G1 of a high level is supplied to turn on an NMOS transistor N1, thereby causing the MTSRC node of a source line to be at a ground state. Further, a voltage is supplied to a drain selection line DSL, a read voltage is supplied to a selected word line WL30, and a pass voltage is supplied to the remaining unselected word lines WL. For example, a voltage of 4.5 V is supplied to the drain selection line DSL, and a pass voltage of 6.5 V is supplied to the unselected word lines.

Next, whether a bit line remains in a precharge state or whether the bit line is discharged to the ground state via the MTSRC node and is therefore in a discharged state is read through the page buffers 11, 13, and 15 according to the state of a selected cell. The read operation is performed through the above process.

However, a typical nonvolatile memory device includes a large number of bit lines. Accordingly, when a read or verification operation is performed, a large amount current instantly flows from the bit lines to the ground terminal via the MTSRC node of the source line, a source line bouncing phenomenon occurs in which the MTSRC node does not maintain an ideal ground state because of resistance components Rs existing in the source line and the source line voltage rises to a set voltage. In this case, charges precharged by the bit lines influence a discharge operation, giving rise to errors when the read or verification operation is performed.

To solve this problem, as shown in FIG. 1, the MTSRC node is coupled to the read voltage supply unit 20 configured to supply a read voltage to a selected word line such that the read voltage supply unit 20 supplies the read voltage which has been increased by a voltage increment at the MTSRC node. That is, the read voltage is increased by a voltage increment of the source line and is then supplied to the selected word line WL30, thereby preventing errors resulting from a source line bouncing phenomenon.

In this method, however, the read voltage supply unit 20 supplies the read voltage changed by reflecting the voltage increment at the MTSRC node. Thus, a time delay occurs until the changed read voltage is supplied to the selected word line WL30. That is, there is a time interval between the time when the voltage at the MTSRC node of the source line rises and the time when the read voltage supply unit 20 supplies the increased read voltage to the selected word line WL30. Furthermore, in the nonvolatile memory device of FIG. 1, a source line bouncing phenomenon is not directly prevented, but errors resulting from a source line bouncing phenomenon are prevented by compensating for a read voltage. Accordingly, the above method can be an indirect solution to the source line bounding phenomenon.

Figure 2:
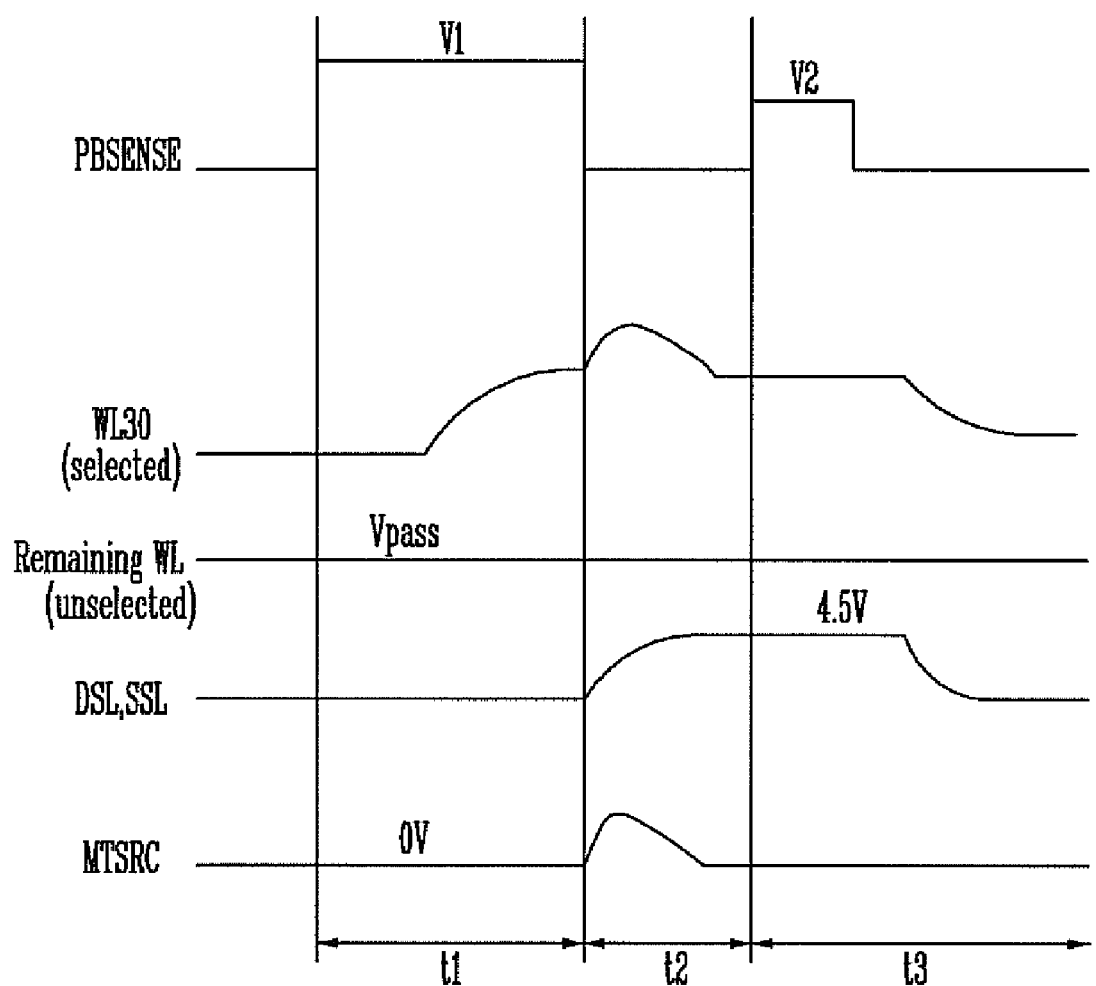
FIG. 2 is a timing diagram showing signals in the nonvolatile memory device of FIG. 1.

FIG. 2 is a timing diagram showing signals in the nonvolatile memory device of FIG. 1.

FIG. 2 shows the bit line sense signal PBSENSE for the page buffers 11, 13, and 15 and the signals for the selected word line WL30, the drain selection line DSL, the source selection line SSL, and the MTSRC node.

During a period t1, the bit line sense signal PBSENSE, supplied to transistors coupled between the bit lines and the sense nodes of the page buffers 11, 13, and 15, maintains a voltage V1 and, at this time, the bit lines are precharged. During this period, a read voltage is supplied to the selected word line WL30. During the periods t1-t3 of FIG. 2, a pass voltage Vpass is supplied to the remaining word lines other than the selected word line WL30.

In a period t2, the bit line sense signal PBSENSE shifts to a low level and, at the same time, a voltage of 4.5 V is supplied to the drain selection line DSL and the source selection line SSL. Thus, charges precharged by the bit lines flow into the ground terminal through the source line. At this time, if a great amount of current instantly flows through the source line from the bit lines, then the voltage at the MTSRC node rises as shown in FIG. 2. When the voltage of the MTSRC node rises, the read voltage supplied to the selected word line WL30 also rises by the voltage increment of the MTSRC node.

In a period t3, data are read from the corresponding cells by sensing a shift in the voltage of the bit line using the bit line sense signal PBSENSE of V2.

As described above, in the nonvolatile memory device of FIG. 1, when the voltage at the MTSRC node of the source line rises, the read voltage supplied to the selected word line WL30 also rises, thereby preventing the occurrence of errors resulting from a source line bouncing phenomenon. In this case, the speed of a shift in the voltage of a word line depending on a shift in the voltage of the MTSRC node can vary according to the characteristics of the read voltage supply unit, and the amount of a shift in the voltage of the word line can change. For this reason, a shift in the voltage of the MTSRC node can be controlled using another method.

Figure 3:
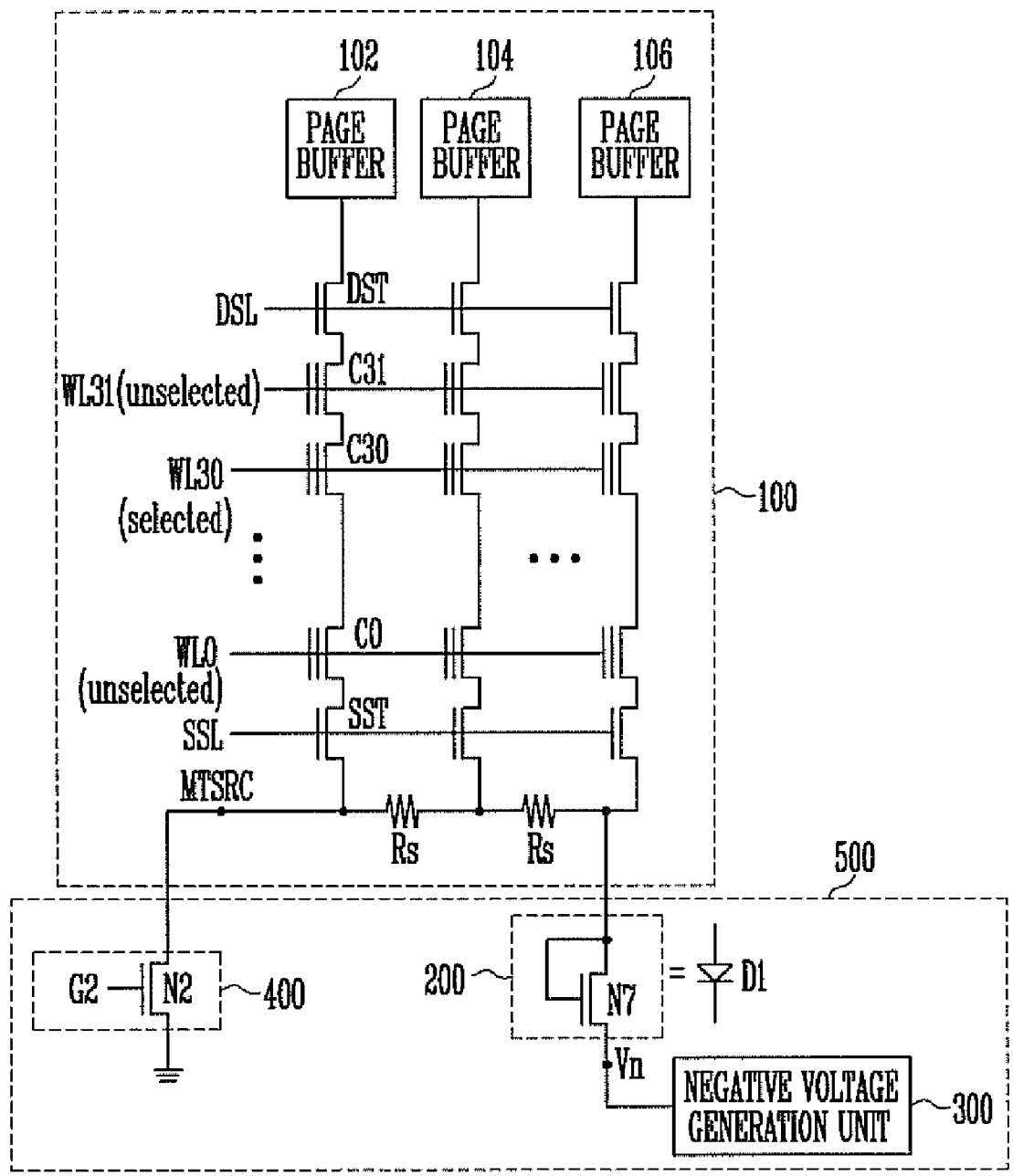
FIG. 3 is a circuit diagram of a nonvolatile memory device according to an embodiment of the present invention.

FIG. 3 is a circuit diagram of a nonvolatile memory device according to an embodiment of the present invention.

Referring to FIG. 3, the nonvolatile memory device includes a memory cell array 100 and a ground voltage maintenance unit 500. The ground voltage maintenance unit 500 is coupled to a source line and is configured to control a voltage of the source line so that the voltage maintains a ground voltage. The ground voltage maintenance unit 500 includes a unilateral element 200, a negative voltage generation unit 300, and a ground voltage supply unit 400. Each of the elements is described in detail below.

The memory cell array 100 includes cell strings coupled between respective bit lines and the source line.

The unilateral element 200 is coupled to the source line. If voltage of the source line is greater than a ground voltage, the unilateral element 200 functions to transfer the source line voltage, which is greater than the ground voltage, to the negative voltage generation unit 300.

In this embodiment of the present invention, the unilateral element 200 can include an NMOS transistor N7 having a gate coupled to its drain. In other embodiments of the present invention, the unilateral element 200 may include a diode D1 having a cathode coupled to the negative voltage generation unit 300 and an anode coupled to the source line.

The negative voltage generation unit 300 is coupled to the unilateral element 200 and is configured to generate a negative voltage. That is, the negative voltage generation unit 300 coupled to the unilateral element 200 functions to generate a negative voltage in response to a voltage increase in the source line. In this embodiment of the present invention, the negative voltage generation unit 300 may further include a negative voltage pump. The negative voltage pump is configured to check a voltage at the output terminal Vn of the unilateral element 200. If, as a result of the check, the voltage at the output terminal Vn of the unilateral element 200 is −0.7 V, the negative voltage pump does not operate. If, as a result of the check, the voltage at the output terminal Vn is more than −0.7 V, the negative voltage pump generates a negative voltage.

In the case in which the unilateral element 200 includes the NMOS transistor N7, the negative voltage generation unit 300 can generate a negative voltage so that the voltage at the output terminal Vn of the unilateral element 200 maintains a negative voltage equal to the threshold voltage of the NMOS transistor N7. For example, assuming that the threshold voltage of the NMOS transistor N7 is 0.7 V, the negative voltage generation unit 300 can generate a negative voltage so that voltage at the output terminal Vn of the unilateral element 200 maintains a negative voltage of −0.7 V. Accordingly, when the voltage of the source line rises to more than the ground voltage, the increased voltage is discharged through the unilateral element 200, and so the voltage of the source line can maintain the ground voltage.

Further, although the voltage at the output terminal Vn of the unilateral element 200 rises because the voltage of the source line rises more than the ground voltage, the negative voltage generation unit 300 generates a negative voltage such that the voltage at the output terminal Vn of the unilateral element 200 is a negative voltage equal to the threshold voltage of the NMOS transistor N7. For example, if the voltage of the source line rises to 0.5 V from the ground voltage because of a source line bouncing phenomenon, etc., the voltage at the output terminal Vn of the unilateral element 200 rises from −0.7 V to −0.2 V. At this time, the negative voltage generation unit 300 generates a negative voltage in order to lower the increased voltage of the output terminal Vn to −0.7 V. As the voltage of the output terminal Vn drops to −0.7 V, the voltage of the source line drops to the ground voltage.

The ground voltage supply unit 400 is configured to couple the source line to the ground terminal. The ground voltage supply unit 400 can include an NMOS transistor N2. A driving signal G2 is inputted to the gate of the NMOS transistor N2. When the driving signal G2 is at a high level, the NMOS transistor N2 is turned on to couple the source line to the ground terminal.

Although an embodiment of the present invention in which the unilateral element 200 includes the NMOS transistor N7 and the diode D1 has been described with reference to FIG. 3, the present invention is not limited to this embodiment. The unilateral element 200 can include a variety of elements. Another embodiment of the present invention in which a PMOS transistor P7 having a source coupled to a gate is used as the unilateral element 200 is illustrated in FIG. 4.

Figure 4:
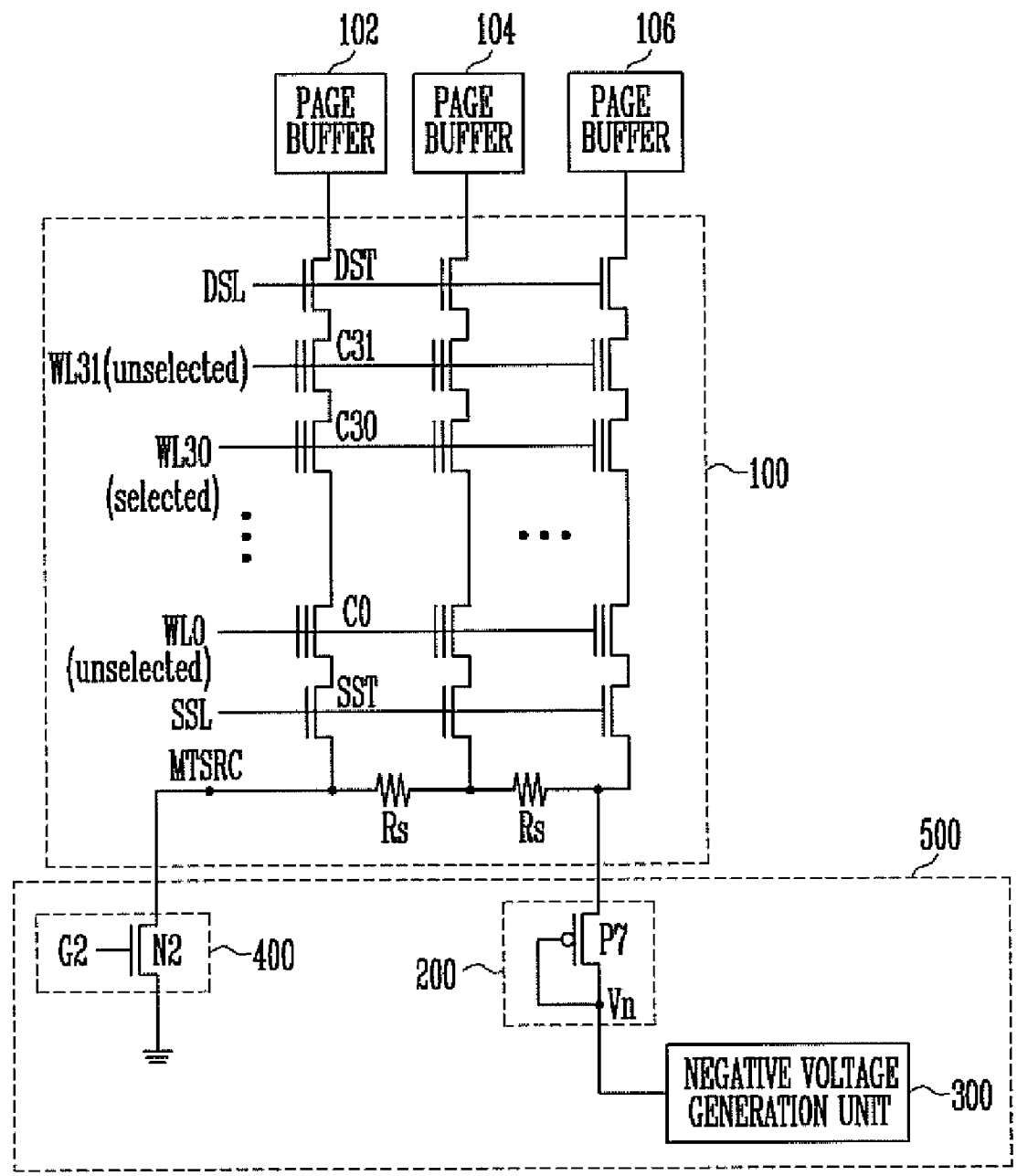
FIG. 4 is a circuit diagram of a nonvolatile memory device according to another embodiment of the present invention.

FIG. 4 is a circuit diagram of a nonvolatile memory device according to another embodiment of the present invention.

Referring to FIG. 4, the unilateral element 200 includes the PMOS transistor P7 having a source coupled to a gate. A negative voltage generation unit 300 generates a negative voltage equal to a threshold voltage of the PMOS transistor P7. For example, if the threshold voltage of the PMOS transistor P7 is 0.7 V, the negative voltage generation unit 300 generates the negative voltage of −0.7 V.

The nonvolatile memory device of FIG. 4 has the same construction as that of FIG. 3 except for the unilateral element 200, and a description thereof has been omitted for the sake of brevity.

Figure 5:
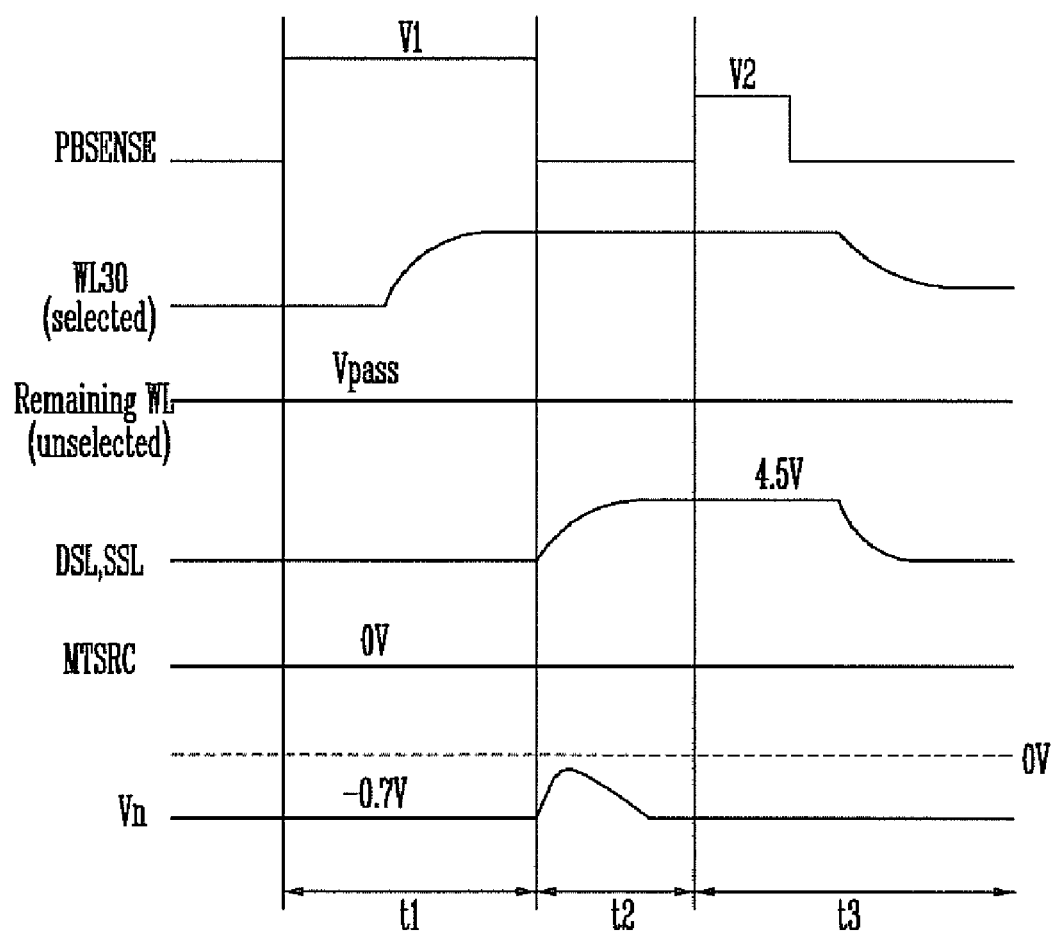
FIG. 5 is a timing diagram showing signals in the nonvolatile memory device of FIGS. 3 and 4.

FIG. 5 is a timing diagram showing signals in the nonvolatile memory device of FIGS. 3 and 4.

FIG. 5 shows the bit line sense signal PBSENSE for the page buffers 102, 104, and 106 and the signals for the selected word line WL30, the drain selection line DSL, the source selection line SSL, the MTSRC node, and the voltage at the output terminal of the unilateral element 200.

During a period t1, a bit line sense signal PBSENSE supplied to transistors coupled between the bit lines and the sense nodes of the page buffers 102, 104, and 106 maintains voltage V1 and, at this time, the bit lines are precharged. During this period, a read voltage is supplied to a selected word line WL30. During the periods t1-t3 of FIG. 5, a pass voltage Vpass is supplied to the remaining word lines WL other than the selected word line WL30.

In a period t2, the bit line sense signal PBSENSE shifts to a low level and, at the same time, a voltage of 4.5 V is supplied to the drain selection line DSL and the source selection line SSL. Thus, charges precharged by the bit lines flow into the ground terminal through the source line. At this time, if a great amount of current instantly flows through the source line from the bit lines, the voltage at the MTSRC node begins to rise. As soon as the voltage at the MTSRC node of the source line begins to rise, charges equal to a voltage increment at the MTSRC node of the source line flow into the negative voltage generation unit 300 via the unilateral element 200.

From the period t2, it can be seen that the voltage at the output terminal Vn of the unilateral element 200 rises as much as the voltage increment supplied to the MTSRC node of the source line and then drops, but a waveform of the voltage at the MRSRC node of the source line maintains a voltage of 0 V.

When the threshold voltage of the NMOS transistor N7 is, for example, 0.7 V, the negative voltage generation unit 300 generates a negative voltage of −0.7 V, and so the voltage at the output terminal Vn of the unilateral element 200 maintains a negative voltage of −0.7 V. During this time, if the voltage at the MTSRC node of the source line rises, charges equal to the voltage increment of the MRSRC node flow into the negative voltage generation unit 300 via the unilateral element 200. Accordingly, the waveform of the voltage at the output terminal Vn of the unilateral element 200 rises to close to 0 V (refer to the period t2) and then drops according to the voltage at the MTSRC node of the source line.

In a period t3, data are read from the corresponding cells by sensing a shift in the voltage of the bit line using the bit line sense signal PBSENSE of V2.

As described above, according to the present invention, when a source line bouncing phenomenon occurs, an increased voltage at the source line is immediately reduced externally through the unilateral element 200. Accordingly, the voltage at the source line can maintain a ground voltage.

Further, a voltage rise at the source line is prevented using the unilateral element and the negative voltage generation unit. Accordingly, a source line bouncing phenomenon can be quickly removed. Further, since the source line bouncing phenomenon is directly removed unlike in the known art, the driving efficiency of the nonvolatile memory device can be improved.

What is claimed is:

1. A nonvolatile memory device, comprising:
    a memory cell array including cell strings coupled between respective bit lines and a source line; a unilateral element coupled to the source line; and
    a negative voltage generation unit coupled to the unilateral element and configured to generate and supply a negative voltage to drive a voltage of the source line to a ground voltage.

2. The nonvolatile memory device of claim 1, wherein the unilateral element comprises a diode having a cathode coupled to the negative voltage generation unit and an anode coupled to the source line.

3. The nonvolatile memory device of claim 2, wherein the negative voltage generation unit is configured to generate the negative voltage equal to a threshold voltage of the diode.

4. The nonvolatile memory device of claim 3, wherein the negative voltage generation unit comprises a negative voltage pump.

5. The nonvolatile memory device of claim 1, wherein the unilateral element comprises an NMOS transistor having a gate and a drain coupled together.

6. The nonvolatile memory device of claim 5, wherein the negative voltage generation unit is configured to generate the negative voltage equal to a threshold voltage of the NMOS transistor.

7. The nonvolatile memory device of claim 1, wherein the unilateral element comprises a PMOS transistor having a gate and a source coupled together.

8. The nonvolatile memory device of claim 7, wherein the negative voltage generation unit is configured to generate the negative voltage equal to a threshold voltage of the PMOS transistor.

9. The nonvolatile memory device of claim 1, further comprising a ground voltage supply unit configured to couple the source line to a ground terminal.

10. The nonvolatile memory device of claim 9, wherein the ground voltage supply unit comprises an NMOS transistor.

* * * * *